US012565692B2

(12) United States Patent
Saito et al.

(10) Patent No.: US 12,565,692 B2
(45) Date of Patent: Mar. 3, 2026

(54) ACTIVE MATERIAL SEPARATION DEVICE

(71) Applicant: HONDA MOTOR CO., LTD., Tokyo (JP)

(72) Inventors: Masafumi Saito, Tokyo (JP); Shigeto Akahori, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 434 days.

(21) Appl. No.: 18/127,025

(22) Filed: Mar. 28, 2023

(65) Prior Publication Data

US 2023/0313334 A1     Oct. 5, 2023

(30) Foreign Application Priority Data

Mar. 31, 2022     (JP) ................................. 2022-059058

(51) Int. Cl.
    *C22B 3/02*        (2006.01)
    *C22B 7/00*        (2006.01)
    *H01L 21/67*      (2006.01)
    *H01M 10/54*    (2006.01)
    *B09B 101/16*   (2022.01)

(52) U.S. Cl.
    CPC ................ *C22B 3/02* (2013.01); *C22B 7/006* (2013.01); *H01L 21/67051* (2013.01); *H01L 21/67057* (2013.01); *H01M 10/54* (2013.01); *B09B 2101/16* (2022.01)

(58) Field of Classification Search
    CPC .......... C22B 3/02; C22B 7/006; H01M 10/54; B09B 2101/16; H01L 21/67051; H01L 21/67057
    See application file for complete search history.

(56) References Cited

U.S. PATENT DOCUMENTS

| | | | |
|---|---|---|---|
| 4,663,247 | A | 5/1987 | Smilanich et al. |
| 5,628,973 | A | 5/1997 | Nishimura et al. |
| 5,785,732 | A | 7/1998 | Tsuchimoto et al. |
| 2012/0091391 | A1 | 4/2012 | Tsuchida et al. |
| 2013/0313485 | A1 | 11/2013 | Kim et al. |

(Continued)

FOREIGN PATENT DOCUMENTS

| | | |
|---|---|---|
| CN | 1396042 | 2/2003 |
| CN | 103311600 | 9/2013 |
| CN | 105210177 | 12/2015 |

(Continued)

OTHER PUBLICATIONS

Chinese Office Action for Chinese Patent Application No. 202310309584.X mailed May 23, 2025.

(Continued)

*Primary Examiner* — Tima M. McGuthry-Banks
(74) *Attorney, Agent, or Firm* — Amin, Turocy & Watson, LLP

(57) ABSTRACT

An active material separation device according to an embodiment of the present invention is an active material separation device configured to separate an active material from a battery member, which includes a container, a base member disposed in the container and configured to support the battery member, and a nozzle disposed above the container and configured to inject a liquid with respect to the battery member, and the nozzle injects the liquid in a state in which a position of an upper surface of the battery member is lower than a position of a liquid surface of the liquid.

7 Claims, 3 Drawing Sheets

(56)　　　　　　　References Cited

U.S. PATENT DOCUMENTS

| | | | |
|---|---|---|---|
| 2023/0055059 | A1 | 2/2023 | Sasaki |
| 2023/0411719 | A1 | 12/2023 | Nishikawa et al. |

FOREIGN PATENT DOCUMENTS

| | | |
|---|---|---|
| CN | 205752435 | 11/2016 |
| CN | 205914500 | 2/2017 |
| CN | 107073432 | 8/2017 |
| CN | 208104505 | 11/2018 |
| CN | 210468030 | 5/2020 |
| DE | 102019133929 | 6/2021 |
| EP | 3195928 | 7/2017 |
| JP | 62-108449 | 5/1987 |
| JP | 06-338352 | 12/1994 |
| JP | 07-205099 | 8/1995 |
| JP | 09-289043 | 11/1997 |
| JP | 2014-046395 | 3/2014 |
| JP | 2014-239141 | 12/2014 |
| JP | 2022-049364 | 3/2022 |
| TW | M520193 | 4/2016 |
| WO | 2010/106618 | 9/2010 |
| WO | 2021/193184 | 9/2021 |

OTHER PUBLICATIONS

Japanese Notice of Allowance for Japanese Patent Application No. 2022-059058 mailed Sep. 24, 2025.

ACTIVE MATERIAL SEPARATION DEVICE

CROSS-REFERENCE TO RELATED APPLICATION

Priority is claimed on Japanese Patent Application No. 2022-059058, filed Mar. 31, 2022, the content of which is incorporated herein by reference.

BACKGROUND OF THE INVENTION

Field of the Invention

The present invention relates to an active material separation device.

Description of Related Art

For the purpose of $CO_2$ reduction from the viewpoint of climate-related disasters, interest in electric vehicles is increasing, and the demand for batteries mounted on electric vehicles is also increasing. Under such circumstances, research on recycling of battery materials is underway. For example, research has focused on high efficiency recovery of a metal used as an active material of an electrode, cost reduction of a recovering process, or the like.

For example, PCT International Publication No. 2010/106618 discloses a battery member processing method including a positive electrode active material recovering process of recovering a positive electrode active material that is an insoluble component by bringing a battery member and processed liquid including water in contact with each other.

SUMMARY OF THE INVENTION

In separation of an active material from an electrode, low damage of the active material is desirable.

An aspect of the present invention is directed to providing an active material separation device capable of separating an active material while suppressing damage.

The aspects of the present invention are as follows.

(1) An active material separation device according to an aspect of the present invention is an active material separation device configured to separate an active material from a battery member containing the active material, the active material separation device including: a container; a base member that is disposed inside of the container and that is configured to support the battery member; and a nozzle that is disposed above the container and that is configured to inject a liquid with respect to the battery member, wherein the nozzle injects the liquid in a state in which a position of an upper surface of the battery member is lower than a position of a liquid surface of the liquid.

(2) In the active material separation device according to the above-mentioned (1), the base member may be movable in a vertical direction.

(3) The active material separation device according to the above-mentioned (1) or (2) may include a waste liquid section that is disposed below the container and that has an opening/closing valve.

(4) The active material separation device according to the above-mentioned (3) may further include a second waste liquid section different from the waste liquid section that is a first waste liquid section.

(5) The active material separation device according to any one of the above-mentioned (1) to (4) may include an annular inner lid portion provided inside of the container.

(6) The active material separation device according to any one of the above-mentioned (1) to (5) may further include a first height measuring part configured to measure a height of the upper surface of the battery member; and a second height measuring part configured to measure a height of the liquid surface of the liquid.

(7) The active material separation device according to the above-mentioned (6) may further include a controller configured to control a distance between the upper surface of the battery member and the liquid surface of the liquid on the basis of the height of the upper surface of the battery member measured by the first height measuring part and the height of the liquid surface of the liquid measured by the second height measuring part.

(8) In the active material separation device according to the above-mentioned (6) or (7), the second height measuring part may calculate the height of the liquid surface of the liquid on the basis of a height of a measurement plate disposed on the liquid surface of the liquid.

(9) The active material separation device according to any one of the above-mentioned (1) to (8) may further include a collecting filter disposed in the container.

According to the aspect of the present invention, it is possible to separate an active material while suppressing damage.

In addition, according to the active material separation device disclosed in the above-mentioned (2), it is possible to further suppress damage to the active material. In addition, scattering of the active material can be suppressed, and recovery efficiency of the active material can be increased.

In addition, according to the active material separation device disclosed in the above-mentioned (3), the liquid can be stored in the container, and the battery member can be submerged in the liquid. Since the active material is separated in a state in which the battery member is submerged in the liquid, scattering of the active material can be suppressed. As a result, recovery efficiency of the active material can be increased.

In addition, according to the active material separation device disclosed in the above-mentioned (4), the liquid in the container can be discharged from the second waste liquid section together with the first waste liquid section, and an emission rate of the liquid can be increased. Accordingly, processing efficiency can be increased. In addition, the height of the liquid surface S is more easily adjusted.

In addition, according to the active material separation device disclosed in the above-mentioned (5), since the inner lid portion suppresses fluctuation of the liquid surface, the separated active material is suppressed from being scattered and adhered to the lid or the inner side surface of the container. For this reason, recovery efficiency of the active material can be improved.

In addition, according to the active material separation device disclosed in the above-mentioned (6), the distance between the upper surface of the battery member and the liquid surface of the liquid can be controlled. Accordingly, collision energy from the jet body received by the battery member can be set to within a proper range. As a result, a separation rate of the active material from the battery member can be maintained at a large rate while suppressing damage to the active material separated from the battery member. In addition, it is possible to suppress scattering of the active material separated from the battery member, and improve recovery efficiency of the active material.

In addition, according to the active material separation device disclosed in the above-mentioned (7), there is no need to manually adjust the distance, and workability is improved.

In addition, according to the active material separation device according to the above-mentioned (8), it is possible to calculate the height of the liquid surface more accurately.

In addition, according to the active material separation device disclosed in the above-mentioned (9), it is possible to improve a recovery rate of the active material.

DETAILED DESCRIPTION OF THE INVENTION

Figure 1:
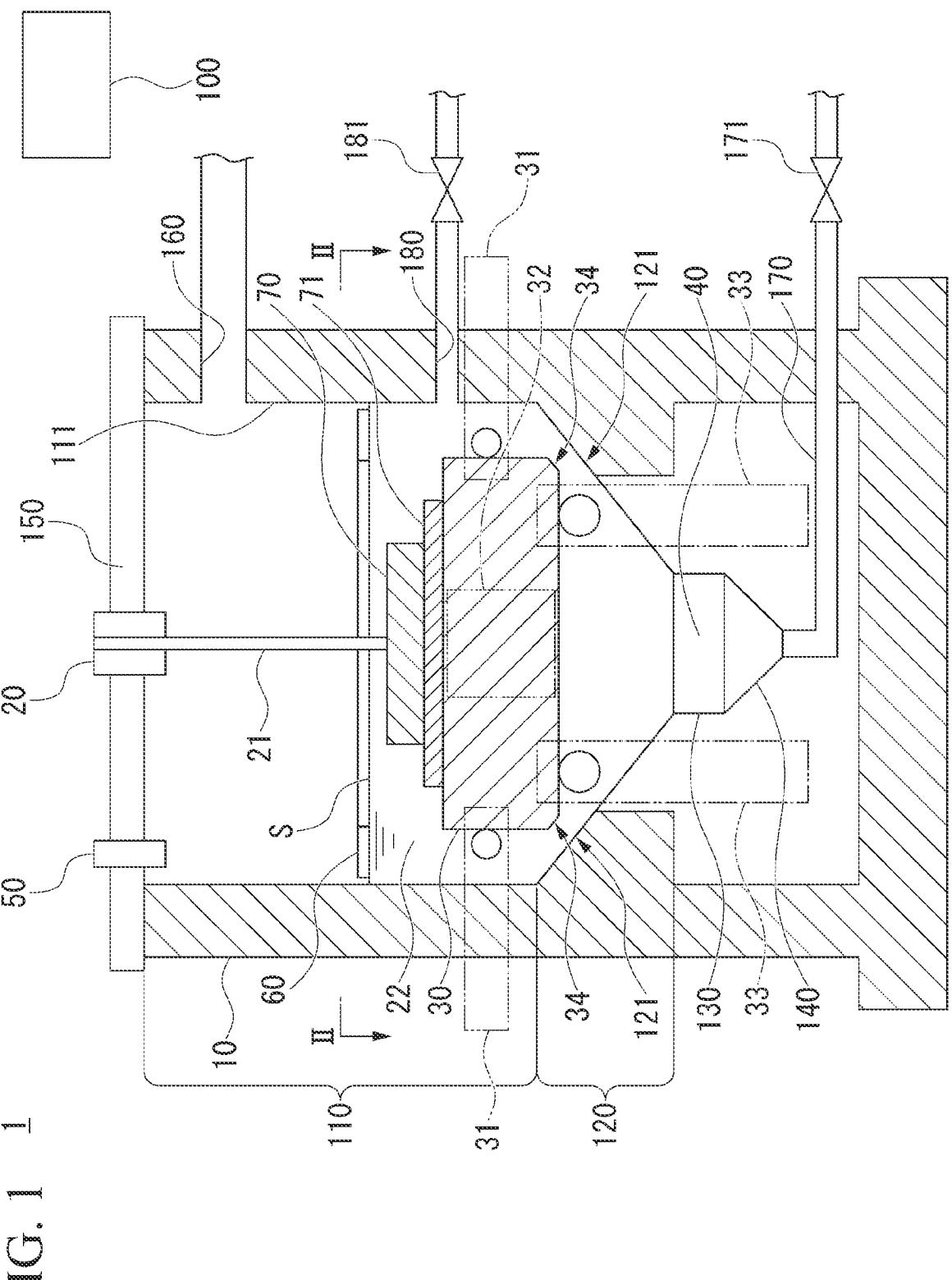
FIG. 1 is a view showing a schematic configuration of an active material separation device according to an embodiment of the present invention.
Figure 2:
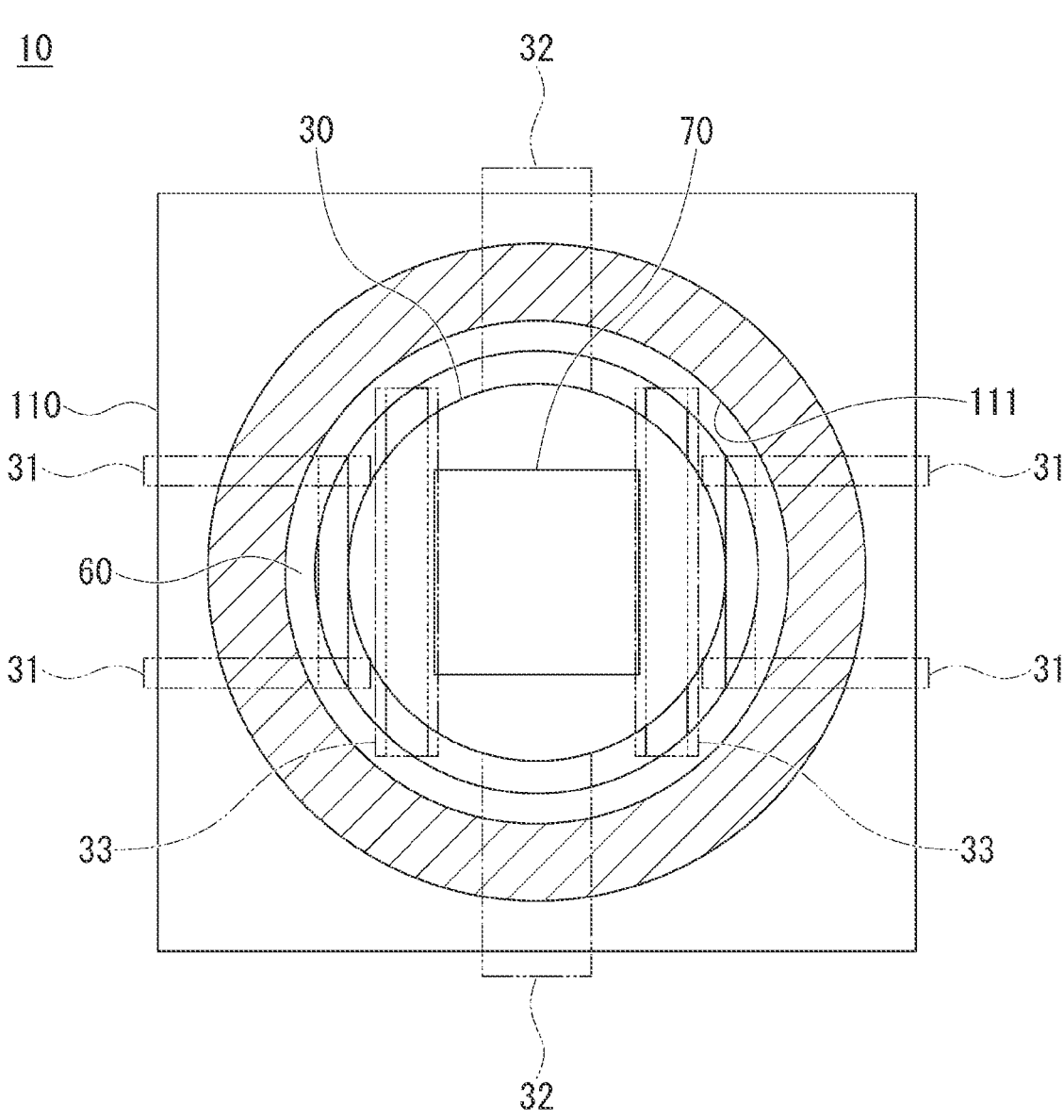
FIG. 2 is a view along line II-II of FIG. 1.

An active material separation device according to an embodiment of the present invention will be described with reference to FIGS. 1 and 2. FIG. 1 is a view showing a schematic configuration of the active material separation device according to the embodiment. FIG. 2 is a view along line II-II of FIG. 1. Further, in the specification and the drawings, components having substantially the same functional configurations are designated by the same reference signs and overlapping description will be omitted.

An active material separation device 1 according to the embodiment is a device configured to separate an active material from a battery member 70. The active material separation device 1 includes a container 10, a nozzle 20 disposed above the container 10, a base member (table) 30 disposed in the container 10, a collecting filter 40 disposed in the container 10, a displacement sensor 50, an inner lid portion 60, and a controller 100.

The container 10 has a drum section 110 having an internal space with substantially the same diameter in a vertical direction, a first diameter-reducing section 120 connected to the drum section 110 and having a diameter reduced downward as shown in FIG. 1, a collecting section 130 connected to the first diameter-reducing section 120, a second diameter-reducing section 140 connected to the collecting section 130 and having a diameter reduced downward, and a lid 150 disposed above the drum section 110 and configured to cover the inside of the container 10. In the first diameter-reducing section 120 and the second diameter-reducing section 140, an area of a horizontal cross section is reduced downward. The first diameter-reducing section 120 has a contact portion 121 with a shape corresponding to a shape of a lower surface edge portion 34 of the table 30 in an inner surface thereof. The collecting filter 40 corresponding to such shape is disposed in the collecting section 130.

In addition, as shown in FIG. 1, the container 10 includes an exhaust port 160, a first waste liquid section 170, and a second waste liquid section 180.

The exhaust port 160 exhausts a jet body 21 injected from the nozzle 20 by the battery member 70 or a gas generated by coming into contact with a liquid 22 that constitutes the jet body 21, to the outside of the container 10. The exhaust port 160 is provided in the drum section 110, and the gas can be discarded easily to the outside of the container 10.

The first waste liquid section 170 is a tubular member, which is connected to a lower end of the second diameter-reducing section 140 of the container 10. The liquid 22 in the container 10 flows downward together with the active material separated from the battery member 70. The active material is collected by the collecting filter 40, and the liquid 22 passes through the collecting filter 40 and is discharged to the outside of the container 10 through a first waste liquid section 170.

A first opening/closing valve 171 is provided in the first waste liquid section 170. When the jet body 21 is injected in a state in which the first opening/closing valve 171 is closed, the liquid 22 is stored in the container 10. By injecting the jet body 21 from the nozzle 20 to the battery member 70 in a state in which a liquid surface S of the stored liquid 22 is higher than a surface of the battery member 70, since collision energy received by the battery member 70 from the jet body 21 is reduced, damage to the active material is suppressed.

The second waste liquid section 180 is a tubular member connected to the inside of the container 10 from a side surface in the drum section 110 of the container 10. The liquid 22 stored in the container 10 is discharged to the outside of the container 10 through the second waste liquid section 180. For this reason, it is possible to increase an emission rate of the liquid 22 by discharging the liquid 22 from the second waste liquid section 180 together with the first waste liquid section 170. In addition, the second waste liquid section 180 is connected to an inner side surface 111 of the drum section 110 and provided at a position higher than the first diameter-reducing section 120. For this reason, the active material included in the liquid 22 discharged from the second waste liquid section 180 is a small amount. Accordingly, in the container 10, discharge of the liquid 22 proceeds without decreasing a recovery rate of the active material. In addition, a second opening/closing valve 181 is provided in the second waste liquid section 180. When the second opening/closing valve 181 is closed, a larger volume of liquid 22 can be stored in the container 10.

The nozzle 20 configured to inject the jet body 21 is provided on the lid 150 of the container 10. The jet body 21 is injected toward the battery member 70 by the nozzle 20.

The jet body 21 is a liquid that reacts with a solid electrolyte material included in the battery member 70. As the jet body 21, for example, a proton type polar solvent can be exemplified, and specifically, water, ethanol, methanol, acetone, or the like, can be exemplified. Further, a mixture thereof may be used as the jet body 21.

The liquid 22 is stored in the container 10, the first waste liquid section 170, and the second waste liquid section 180 after the liquid that constitutes the jet body 21 or the jet body 21 collides with the battery member 70. The liquid 22 that has collided with the battery member 70 contains a soluble ingredient of the battery member 70, in addition to the ingredient of the jet body 21.

The nozzle 20 injects the jet body 21 in a state in which a position on an upper surface of the battery member 70 is lower than a position on the liquid surface S of the liquid 22. The liquid 22 stored in the container 10 before injection of the jet body 21 starts may be fed into the container 10 from a feeding port (not shown). In addition, the liquid may be fed by the nozzle 20 before the battery member 70 is installed on the table 30. When a plurality of nozzles 20 are provided, the liquid 22 may be fed by the nozzles 20 other than the nozzle 20 through which the jet body 21 is oriented toward the battery member 70. This liquid 22 is adjusted such that the liquid surface S reaches a position higher than the upper surface of the battery member 70. In this state, since collision energy of the liquid 22 received by the battery member 70 is reduced by the nozzle 20 injecting the jet body 21 toward the battery member 70, it is possible to suppress damage to the active material separated from the battery member 70. In addition, it is possible to suppress scattering of the active material separated from the battery member 70, and improve recovery efficiency of the active material.

The nozzle 20 may be controlled by the controller 100, which will be described below.

The table 30 supports the battery member 70. The table 30 moves at least in the horizontal direction. For example, as shown in FIGS. 1 and 2, the table 30 has a plurality of first shafts 31 extending in one direction in a horizontal plane, and a plurality of second shafts 32 perpendicular to the plurality of first shafts 31 in the horizontal plane. The table 30 moves in the axial direction as the first shafts 31 and the second shafts 32 move in axial directions thereof, respectively. Accordingly, the table 30 is movable in the horizontal direction.

In addition, as shown in FIG. 1, the table 30 has a plurality of third shafts 33 extending in the vertical direction. The third shafts 33 can move the table 30 in the vertical direction. It is possible to adjust a distance between the battery member 70 and the nozzle 20 and adjust collision energy of the jet body 21 with the battery member 70 by moving the battery member 70 in the vertical direction using the third shafts 33. As a result, the nozzle 20 can have a simple configuration. Accordingly, device costs can be reduced.

In addition, each of the third shafts 33 is operable independently and when only one third shaft 33 is raised or lowered, the side of the table 30 corresponding to such third shaft 33 is raised or lowered. As a result, the table 30 is inclined with respect to the horizontal direction. In a case the table 30 is not inclined, even after the separation processing of the active material, the active material is likely to remain on the surface of the table 30. If the active material remains on the surface of the table 30, it becomes difficult to stably dispose the battery member 70 that is the next processing object on the table 30. For this reason, while a process of washing with water or the like is performed in order to remove the active material remaining on the table 30, it becomes easy to remove the active material remaining on the table 30 by inclining the table 30.

As shown in FIG. 1, the lower surface edge portion 34 of the table 30 has a shape corresponding to the shape of the contact portion 121 in the first diameter-reducing section 120. The table 30 is moved by the third shafts 33 in the vertical direction, the lower surface edge portion 34 of the table 30 comes into contact with the contact portion 121 of the first diameter-reducing section 120, and thus, the inside of the container 10 is divided into a first space above the contact portion 121 and a second space below the contact portion.

The liquid 22 stored in the container 10 can be discharged from the first waste liquid section 170 and the second waste liquid section 180, and the active material precipitated in the collecting filter 40 and the first diameter-reducing section 120 may rise up in the liquid 22. In this case, the risen active material may be discharged to the outside from the second waste liquid section 180 together with the liquid 22. However, in a state in which the liquid 22 is stored in the container 10 and the active material is precipitated in the vicinity of the collecting filter 40 and on the collecting filter 40 of the first diameter-reducing section 120, when the lower surface edge portion 34 of the table comes into contact with the contact portion 121 of the first diameter-reducing section

120 and the inside of the container 10 is divided into the first space and the second space, even though the active material rises upon discharge of the liquid 22, it is possible to prevent the active material from rising up until the first space and to prevent the active material from being discharged from the second waste liquid section 180. As a result, it is possible to suppress a decrease in recovery rate of the active material.

The displacement sensor 50 is a device configured to measure a height of the liquid surface S of the liquid 22 in the container 10 and a height of the upper surface of the battery member 70, which is provided on the lid 150. The displacement sensor 50 is, for example, a laser displacement sensor that radiates a laser downward and measures a height of the upper surface of the battery member 70 and a height of the liquid surface S. Accordingly, the displacement sensor 50 is referred to as a first height measuring part configured to measure a height of the upper surface of the battery member 70 and also a second height measuring part configured to measure a height of the liquid surface of the liquid 22.

The plurality of displacement sensors 50 are preferably provided to simultaneously measure a height of the upper surface of the battery member 70 and a height of the liquid surface S. It is possible to control a distance between the upper surface of the battery member 70 and the liquid surface S of the liquid 22 more accurately by simultaneously measuring the height of the upper surface of the battery member 70 and the height of the liquid surface S using a controller 100, which will be described below.

In addition, it is preferable to measure the height of the liquid surface S using the plurality of displacement sensors 50 to more accurately obtain the height of the liquid surface S. For example, the plurality of displacement sensors 50 are provided at equal intervals along the inner side surface 111, and the height of the liquid surface S can be more accurately measured by setting an average value of the height of each of the liquid surfaces S measured by the plurality of displacement sensors 50 to the height of the liquid surface S.

The inner lid portion 60, which is an annular member, is composed of a material with a lower density than the liquid 22 and is able to float on the liquid surface S. An outer shape of the inner lid portion 60 is a shape corresponding to the inner side surface 111 of the drum section 110 when seen in a plan view, and an outer diameter of the inner lid portion 60 substantially coincides with an inner diameter in the horizontal plane of the drum section 110 of the container 10. In a state in which the inner lid portion 60 floats on the liquid surface S, when the separation processing of the active material is performed, since the inner lid portion 60 suppresses fluctuation of the liquid surface S, it is possible to suppress the separated active material from being scattered together with the liquid 22 and adhering to the lid 150 or the inner side surface 111 of the container 10. Accordingly, since recovery of the active material adhered to the lid 150 or the inner side surface 111 is facilitated, recovery efficiency of the active material can be improved. In addition, when the battery member 70 contains, for example, a sulfide-based solid electrolyte and water is used in the jet body 21, while hydrogen sulfide is generated through a reaction with the jet body 21 by the separation processing, the generated hydrogen sulfide is easily dissolved in the liquid 22 by disposing the inner lid portion 60 on the liquid surface S. As a result, since the hydrogen sulfide dissolved in the liquid 22 is easier to handle than gaseous hydrogen sulfide, the hydrogen sulfide can be easily recovered.

The inner lid portion 60 may be used as a measurement plate, a height of an upper surface of which is measured by the displacement sensor 50, and a height of the liquid surface S of the liquid 22 is calculated on the basis of the height thereof. For example, a value obtained by subtracting the height of the thickness of the inner lid portion 60 exposed from the liquid surface S from the height of the upper surface of the inner lid portion 60 measured by the displacement sensor 50 may be set as a height of the liquid surface S. A height of the portion in the thickness of the inner lid portion 60 exposed from the liquid surface S may be calculated based on, for example, a density of the liquid 22 and a density of the inner lid portion 60.

In addition, an inner diameter of the inner lid portion 60 is greater than a maximum length of the battery member 70 in the horizontal direction. Since the inner diameter of the inner lid portion 60 is greater than the maximum length of the battery member 70 in the horizontal direction, attachment and detachment of the battery member 70 to/from the table 30 can be easily performed.

The controller 100 controls a distance between the upper surface of the battery member 70 and the liquid surface S of the liquid 22 on the basis of the height of the upper surface of the battery member 70 measured by the displacement sensor 50 and the height of the liquid surface S of the liquid 22 measured by the displacement sensor 50. The controller 100 receives information of the height of the upper surface of the battery member 70 and information of the height of the liquid surface S of the liquid 22 measured by the displacement sensor 50 from the displacement sensor 50, and performs at least one of change of the position of the table 30, opening/closing of the first opening/closing valve 171, and opening/closing of the second opening/closing valve 181 on the basis of these pieces of information. Accordingly, a distance between the upper surface of the battery member 70 and the liquid surface S of the liquid 22 is controlled. As a result, the collision energy received by the battery member 70 from the jet body 21 can be within a proper range, and the damage to the active material separated from the battery member 70 can be further suppressed. In addition, it is possible to suppress scattering of the active material separated from the battery member 70 and improve recovery efficiency of the active material.

The controller 100 is realized by hardware including, for example, an arithmetic unit such as a CPU or the like, a main storage device such as read only memory (ROM), a random access memory (RAM), or the like, and an auxiliary storage device such as a hard disk, a flash memory, or the like. The controller 100 may be constituted by one piece of hardware or may be constituted by a plurality of pieces of hardware. Further, the controller 100 may be realized by an embedded system.

The battery member 70 is a processing object of the active material separation device according to the embodiment. The battery member 70 has, for example, a positive electrode active material having Li, and a solid electrolyte material. The battery member 70 may have at least one of a conductive material and a negative electrode active material.

The positive electrode active material is not particularly limited but contains, for example, Li. The positive electrode active material is usually not dissolved in the jet body 21 and the liquid 22. As the positive electrode active material, for example, a layered positive electrode active material, a spinel type positive electrode active material, an olivine type positive electrode active material, or the like, may be exemplified. As the layered positive electrode active material, for example, $LiCoO_2$, $LiNiO_2$, $LiCo_{1/3}Ni_{1/3}Mn_{1/3}O_2$, $LiVO_2$, $LiCrO_2$, or the like, may be exemplified. As the spinel type positive electrode active material, for example, $LiMn_2O_4$, $LiCoMnO_4$, $Li_2NiMn_3O_8$, $LiNi_{0.5}Mn_{1.5}O_4$, or the like, may be exemplified. As the olivine type positive electrode active material, for example, $LiCoPO_4$, $LiMnPO_4$, $LiFePO_4$, or the like, may be exemplified.

The solid electrolyte material contains an ingredient dissolved in the jet body 21 and the liquid 22. The solid electrolyte material contains, for example, Li and S. It is preferable that the solid electrolyte material does not contain an ingredient that does not dissolve in the jet body 21 and the liquid 22. If the solid electrolyte material is composed of only an ingredient dissolved in the jet body 21 and the liquid 22, the separation processing of the insoluble component and the positive electrode active material is unnecessary, and recovery of the positive electrode active material becomes easy. As the solid electrolyte material containing Li and S, for example, a material having Li, S and a third ingredient may be exemplified. As the third ingredient, for example, at least one or more selected from the group consisting of P, Ge, B, Si, I, Al, Ga and As may be exemplified. As the sulfide solid electrolyte material, it may be compound containing $Li_2S$ and sulfide other than the $Li_2S$.

As the negative electrode active material, for example, a metal active material and a carbon active material may be exemplified. As the metal active material, for example, In, Al, Si, Sn, or the like, may be exemplified. As the carbon active material, for example, mesocarbon micro beads, highly oriented graphite, hard carbon, soft carbon, or the like, may be exemplified.

As the conductive material, for example, acetylene black, a carbon fiber, or the like, may be exemplified.

In addition, the battery member 70 may have a current collecting foil 71. The current collecting foil 71 is, for example, an aluminum foil provided on a positive electrode of the battery member 70 or a copper foil provided on a negative electrode of the battery member 70.

Hereinabove, the active material separation device 1 according to the embodiment has been described. Next, an example of a separation method of an active material from the battery member 70 using the active material separation device 1 according to the embodiment will be described.

First, in a state in which the first opening/closing valve 171 and the second opening/closing valve 181 are closed, the battery member 70 is disposed on the upper surface of the table 30. The liquid 22 is fed into the container 10 from the nozzles 20 other than the nozzle 20 through which the jet body 21 is directed toward the battery member 70 or the feeding port (not shown), and the liquid surface S is adjusted to reach a position higher than the upper surface of the battery member 70. Specifically, the position of the liquid surface S and the position of the upper surface of the battery member 70 are measured by the displacement sensor 50 while feeding the liquid 22 stored in the container 10. When the controller 100 receives the information of the position of the liquid surface S and the information of the position of the upper surface of the battery member 70 and the distance between the upper surface of the battery member 70 and the liquid surface S of the liquid 22 has become within a preset range, the controller 100 instructs the nozzle 20 to inject the jet body 21 into the battery member 70.

Next, the jet body 21 is injected from the nozzle 20 toward the battery member 70. The solid electrolyte material of the battery member 70 is dissolved in the jet body 21, and the active material is separated from the battery member 70 due to collision of the jet body 21 with the battery member 70. The table 30 is moved by the first shafts 31 and the second shafts 32 in the horizontal direction, and a collision position of the jet body 21 in the battery member 70 is changed. The liquid 22 is stored in the container 10 and the position of the liquid surface S is raised while the jet body 21 is injected. Meanwhile, the active material separated from the battery member 70 is precipitated on the collecting filter 40. During this time, the position of the liquid surface S and the position of the upper surface of the battery member 70 are measured by the displacement sensor 50. The controller 100 receives the information of the position of the liquid surface S and the information of the position of the upper surface of the battery member 70. When the distance between the upper surface of the battery member 70 and the liquid surface S of the liquid 22 becomes a preset value or more, the controller 100 performs at least one of lowering of the position of the table 30, opening of the first opening/closing valve 171, and opening of the second opening/closing valve 181. Accordingly, the distance between the upper surface of the battery member 70 and the liquid surface S of the liquid 22 is adjusted within a preset range, and the separation processing is continued.

After the separation of the active material from the battery member 70 on the table 30 is terminated, injection of the jet body 21 from the nozzle 20 is stopped and stood still. Precipitation of the active material advances due such standstill.

After the standstill, the table 30 is lowered to bring the contact portion 121 in the first diameter-reducing section 120 and the lower surface edge portion 34 in the table 30 in contact with each other. Accordingly, the inside of the container 10 is divided into the first space below the contact portion 121 and the second space above the contact portion 121.

After that, the first opening/closing valve 171 and the second opening/closing valve 181 are opened, and the liquid 22 stored in the container 10 is discharged to the outside of the container 10. Here, the first waste liquid section 170 discharges the liquid 22 stored in the first space, and the second waste liquid section 180 discharges the liquid 22 stored in the second space. Accordingly, the active material is collected on the collecting filter 40.

According to the necessity, the table 30 is moved upward to release the contact between the contact portion 121 and the lower surface edge portion 34 in the table 30, and further, only one of the third shafts 33 and 33 is operated to incline the table 30. After the table 30 is inclined, the jet body 21 is injected from the nozzle 20 toward the table 30. Accordingly, the active material remaining on the table 30 is removed from the table 30, and the removed active material is collected on the collecting filter 40.

After the separation processing of the active material from the one battery member 70 is terminated, the table 30 is moved to an initial position, a newly processed battery member 70 is disposed on the table 30, and the operations are repeated. Hereinabove, an example of the separation method of the active material from the battery member 70 using the active material separation device 1 according to the embodiment has been described. As described above, the embodiment of the present invention is the separation method of the active material, the separation method of the active material performed by the active material separation device including the container, the base member that is disposed inside of the container and configured to support the battery member, and the nozzle disposed above the container and configured to inject a liquid to the battery member is an active material separation method of separating an active material from the battery member containing the active material using the liquid injected from the nozzle, which is referred to as the active material separation method of injecting the liquid from the nozzle in a state in which the position of the upper surface of the battery member is lower than the position of the liquid surface of the liquid.

Hereinabove, the active material separation device 1 according to the embodiment of the present invention has been described. As described above, the active material separation device 1 includes the container 10, the base member (table) 30 that is disposed inside of the container 10 and that is configured to support the battery member 70, and the nozzle 20 that is disposed above the container 10 and that is configured to inject the jet body 21 with respect to the battery member 70. The nozzle injects the jet body 21 in a state in which the position of the upper surface of the battery member 70 is lower than the position of the liquid surface S of the liquid 22. The solid electrolyte material of the battery member 70 is dissolved by the jet body 21, and further, the active material is separated from the battery member 70 due to the collision of the jet body 21 with the battery member 70. While the damage to the active material is increased when the active material is separated by mechanical machining such as polishing or the like, according to the embodiment, damage to the active material can be suppressed. Further, since the jet body 21 is injected toward the battery member 70 in a state in which the position of the upper surface of the battery member 70 is lower than the position of the liquid surface S of the liquid 22, collision energy received by the battery member 70 can be reduced by the liquid 22 stored in the container 10, and damage to the active material separated from the battery member 70 can be suppressed. Accordingly, according to the embodiment, it is possible to separate the active material while suppressing the damage.

In addition, since the table 30 is movable in the vertical direction, it is possible to adjust the distance between the battery member 70 and the nozzle 20 and adjust the collision energy of the jet body 21 with respect to the battery member 70. Accordingly, it is possible to suppress damage to the active material separated from the battery member 70. In addition, it is possible to suppress scattering of the active material separated from the battery member 70 and improve recovery efficiency of the active material. In addition, there is no need to adjust a flow rate of the injection flow with the nozzle 20. As a result, the nozzle 20 can be configured simply and device costs can be reduced.

In addition, since the first waste liquid section 170 has the first opening/closing valve 171, the liquid 22 can be stored in the container 10, and the battery member 70 can be submerged in the liquid 22. Since the active material is separated in a state in which the battery member 70 is submerged in the liquid 22, scattering of the active material can be suppressed. As a result, recovery efficiency of the active material can be increased.

In addition, since the second waste liquid section 180 different from the first waste liquid section 170 is provided, the liquid 22 in the container 10 can be discharged from the second waste liquid section 180 together with the first waste liquid section 170, and an emission rate of the liquid 22 can be increased. In addition, since the liquid 22 is discharged to the outside of the container 10 with the plurality of waste liquid sections, the height of the liquid surface S can be easily adjusted.

In addition, since the annular inner lid portion 60 disposed in the container 10 suppresses fluctuation of the liquid surface S, scattering of the separated active material and adhesion of the scattered active material to the lid 150 or the inner side surface 111 of the container 10 are suppressed. For this reason, it is possible to improve recovery efficiency of the active material.

In addition, since the displacement sensor 50 that is a first height measuring part configured to measure a height of the upper surface of the battery member 70 and the displacement sensor 50 that is a second height measuring part configured to measure a height of the liquid surface S of the liquid 22 are provided, it is possible to control the distance between the upper surface of the battery member 70 and the liquid surface S of the liquid 22. Accordingly, the collision energy from the jet body 21 received by the battery member 70 can be set to be within a proper range. As a result, the separation rate of the active material from the battery member 70 can be maintained at a large rate while suppressing the damage to the active material separated from the battery member 70. In addition, it is possible to suppress scattering of the active material separated from the battery member 70 and improve recovery efficiency of the active material.

In addition, since the controller 100 controls the distance between the upper surface of the battery member 70 and the liquid surface S of the liquid 22 on the basis of the height of the upper surface of the battery member 70 measured by the displacement sensor 50 and the height of the liquid surface S of the liquid 22 measured by the displacement sensor 50, there is no need to manually adjust the distance, and workability is improved.

In addition, since the displacement sensor 50 calculates the height of the liquid surface S of the liquid 22 on the basis of the height of the inner lid portion 60, it is possible to calculate the height of the liquid surface S more accurately.

In addition, since the collecting filter 40 is disposed inside of the container 10 and the distance to the collecting filter 40 from the position where the battery member 70 is disposed is shortened, recovery loss of the active material is reduced. Accordingly, a recovery rate of the active material can be improved.

Hereinabove, while the embodiment of the present invention has been described, the present invention is not limited thereto. The above-mentioned is merely an example, anything that has substantially the same configuration as the technical scope disclosed in the claims of the present invention and exhibits the same effect is included in the technical scope of the present invention.

Figure 3:
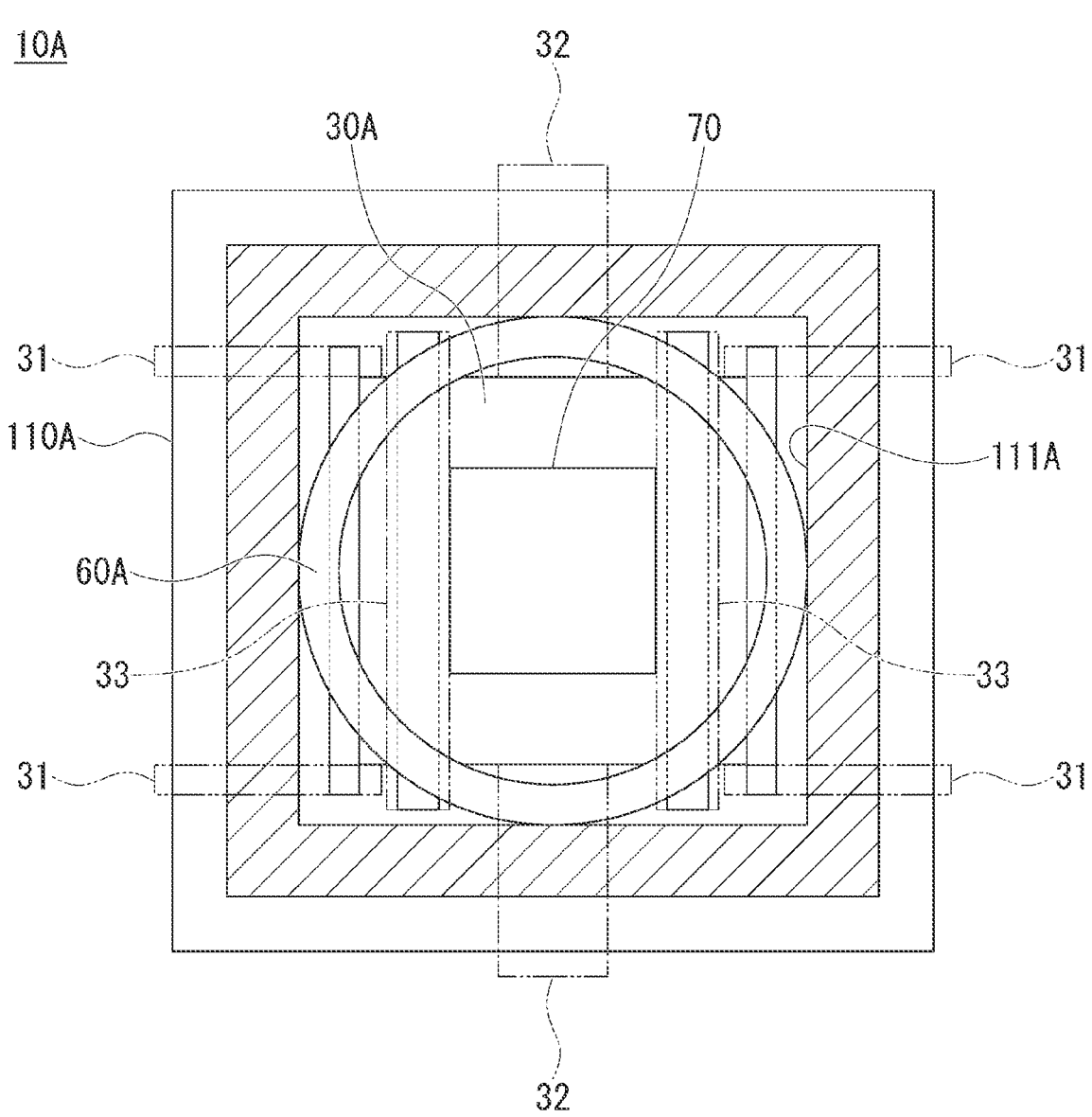
FIG. 3 is a view along line II-II of FIG. 1 showing a variant of the active material separation device according to the same embodiment.

For example, while the shape of the inner side surface 111 of the drum section 110 in the horizontal cross section is a circular shape in the above-mentioned embodiment, the shape of the inner side surface 111 in the horizontal cross section may not be circular. For example, as shown in FIG. 3, the shape of the inner side surface 111A of the drum section 110A in the horizontal cross section may be a square shape. In this case, a shape of the first diameter-reducing section in the horizontal cross section is also a square shape. Further, a shape of the table 30A in the horizontal cross section is a quadrangular shape. Then, a lower end portion of the table 30A and a contact portion of the first diameter-reducing section come into contact with each other, and the inside of the container 10A is divided into the first space and the second space.

In addition, for example, while the exhaust port 160 is provided in the drum section 110 in the above-mentioned embodiment, the lid 150 may be provided.

In addition, for example, while the liquid 22 is stored in the container 10 by the first opening/closing valve 171 provided in the first waste liquid section 170 without being discharged in the above-mentioned embodiment, instead of the first opening/closing valve 171, the opening/closing valve may be provided on a lower end of the second diameter-reducing section 140.

In addition, for example, a collecting filter (not shown) may be provided in the second waste liquid section 180. Even when the active material is flowed to the second waste liquid section 180 by the collecting filter provided in the second waste liquid section 180, since the active material is collected by the collecting filter, it is possible to prevent decrease in recovery rate of the active material.

In addition, the second waste liquid section is not limited to one, and a plurality of second waste liquid sections may be provided.

In addition, the nozzle is not limited to one, and a plurality of nozzles may be provided. According to the plurality of nozzles, a plurality of jet bodies can be injected, and the separation rate of the active material can be increased. When the plurality of nozzles are provided, disposition thereof may be determined according to a size or a shape of the battery member.

In addition, the battery member is supported by an upper surface of a support member (not shown) smaller than the table, and the support member may be provided on the table. Disposition of the battery member to the table is facilitated by the support member.

In addition, the displacement sensor is not limited to one, and a plurality of displacement sensors may be provided. When the plurality of displacement sensors are provided, the sensors are preferably provided at equal intervals along an inner side surface of the container. Since the plurality of displacement sensors are provided along the inner side surface of the container, it is possible to reduce an influence on the fluctuation of the liquid surface by the jet body injected from the nozzle. In addition, since the plurality of displacement sensors are provided at equal intervals, it is possible to measure the position of the liquid surface more accurately.

In the above-mentioned embodiment, the outer shape of the inner lid portion 60 is a shape corresponding to the shape of the inner side surface 111, and the outer shape of the inner lid portion 60 substantially coincides with the diameter of the drum section 110 in the horizontal plane. However, the outer shape of the inner lid portion may not correspond to the shape of the inner side surface, and for example, as shown in FIG. 3, the outer shape of the inner lid portion 60A is a circular shape while the shape of the inner side surface 111A of the drum section 110A is a quadrangular shape when seen in a plan view. In this way, the outer shape of the inner lid portion may be different from the shape of the inner side surface of the drum section.

In addition, while the position of the upper surface of the inner lid portion 60 is measured by the displacement sensor 50 in the above-mentioned embodiment, a plate different from the inner lid portion 60 may be disposed on the liquid surface S, and the position of the upper surface of the plate may be measured.

The battery member is not limited to those containing the above-mentioned materials, and the present invention can set the battery member containing various ingredients that dissolves in the jet body as a target.

In addition, at least, the first opening/closing valve 171, the second waste liquid section 180, the third shafts 33, the collecting filter 40, and the inner lid portion 60 are of arbitrary configuration, and it does not necessarily have to be included in the active material separation device according to the present invention. When the collecting filter is not provided, the collecting filter may be provided outside the container 10, and the active material may be recovered by the collecting filter.

The above-mentioned configuration may be appropriately omitted within a range in which the effect of the present invention exhibits. In addition, the separation method of the active material from the above-mentioned battery member 70 is also merely an example, and as appropriate, an order of processes may be changed or omitted within a practicable range.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An active material separation device configured to separate an active material from a battery member containing the active material, the active material separation device comprising:

a container;

a base member that is disposed inside of the container and that is configured to support the battery member;

a nozzle that is disposed above the container and that is configured to inject a liquid with respect to the battery member; and an annular inner lid portion provided inside of the container, wherein the nozzle injects the liquid in a state in which a position of an upper surface of the battery member is lower than a position of a liquid surface of the liquid.

2. The active material separation device according to claim 1, wherein the base member is movable in a vertical direction.

3. The active material separation device according to claim 1, comprising a first waste liquid section that is disposed below the container and that has an opening/closing valve.

4. The active material separation device according to claim 3, further comprising a second waste liquid section different from the first waste liquid section.

5. An active material separation device configured to separate an active material from a battery member containing the active material, the active material separation device comprising:

a container;

a base member that is disposed inside of the container and that is configured to support the battery member;

a nozzle that is disposed above the container and that is configured to inject a liquid with respect to the battery member;

a first height measuring part configured to measure a height of the upper surface of the battery member; and a second height measuring part configured to measure a height of the liquid surface of the liquid, wherein the nozzle injects the liquid in a state in which a position of an upper surface of the battery member is lower than a position of a liquid surface of the liquid, and wherein the second height measuring part calculates the height of the liquid surface of the liquid on the basis of a height of a measurement plate disposed on the liquid surface of the liquid.

6. The active material separation device according to claim 5, further comprising a controller configured to control a distance between the upper surface of the battery member and the liquid surface of the liquid on the basis of the height of the upper surface of the battery member measured by the first height measuring part and the height of the liquid surface of the liquid measured by the second height measuring part.

7. An active material separation device configured to separate an active material from a battery member containing the active material, the active material separation device comprising:

a container;

a base member that is disposed inside of the container and that is configured to support the battery member;

a nozzle that is disposed above the container and that is configured to inject a liquid with respect to the battery member; and a collecting filter disposed in the container, wherein the nozzle injects the liquid in a state in which a position of an upper surface of the battery member is lower than a position of a liquid surface of the liquid.

* * * * *